United States Patent
Jow et al.

(10) Patent No.: US 8,058,956 B2
(45) Date of Patent: Nov. 15, 2011

(54) HIGH FREQUENCY AND WIDE BAND IMPEDANCE MATCHING VIA

(75) Inventors: Uei-Ming Jow, Hsinchu (TW);
Ching-Liang Weng, Hsinchu (TW);
Ying-Jiunn Lai, Hsinchu (TW);
Chang-Sheng Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/801,673

(22) Filed: Jun. 21, 2010

(65) Prior Publication Data

US 2010/0259338 A1    Oct. 14, 2010

Related U.S. Application Data

(62) Division of application No. 11/246,112, filed on Oct. 11, 2005.

(30) Foreign Application Priority Data

Jan. 14, 2005  (TW) ................. 94104223 A

(51) Int. Cl.
*H03H 7/38* (2006.01)
*H01P 1/04* (2006.01)
(52) U.S. Cl. ........................ 333/260; 333/33
(58) Field of Classification Search .......... 333/32, 333/33, 238, 246, 260
See application file for complete search history.

(56) References Cited

U.S. PATENT DOCUMENTS

| | | | |
|---|---|---|---|
| 4,494,083 A | 1/1985 | Josefsson et al. | |
| 6,677,839 B2 * | 1/2004 | Aruga | 333/246 |
| 6,738,598 B2 | 5/2004 | Wu et al. | |
| 6,807,065 B2 | 10/2004 | Sato | |
| 6,930,240 B1 | 8/2005 | Giboney et al. | |
| 6,933,450 B2 | 8/2005 | Okumichi et al. | |
| 7,030,712 B2 | 4/2006 | Brunette et al. | |
| 2001/0015288 A1 | 8/2001 | Dove et al. | |
| 2002/0159243 A1 | 10/2002 | Ogawa et al. | |
| 2004/0053014 A1 | 3/2004 | Sato | |

FOREIGN PATENT DOCUMENTS
EP     1341254     3/2003

OTHER PUBLICATIONS
Chinese Office Action dated Oct. 10, 2008.
Chinese Office Action dated Mar. 28, 2008.

* cited by examiner

*Primary Examiner* — Stephen Jones
(74) *Attorney, Agent, or Firm* — Morris Manning Martin LLP; Tim Tingkang Xia, Esq.

(57) ABSTRACT

A high frequency and wide band impedance matching via is provided, applicable to multi-layer printed circuit boards, for example. The multi-layer circuit board may include several signal transmission traces, several ground layers, signal transmission vias and ground vias. The signal transmission traces and the ground layers may be sited on different circuit layers, and each signal transmission trace may be opposite to one of the ground layers. The signal transmission vias may be connected between the signal transmission traces. The ground vias may be connected between the ground layers. The ground vias may be opposite to the signal transmission vias, and the ground vias corresponding to the signal transmission vias may be sited to stabilize the characteristic impedance of the transmission traces.

6 Claims, 11 Drawing Sheets

HIGH FREQUENCY AND WIDE BAND IMPEDANCE MATCHING VIA

This application is a Divisional of U.S. application Ser. No. 11/246,112 filed Oct. 11, 2005, which claims priority from TW 94101223, filed Jan. 14, 2005, the entirety of both references incorporated by reference herein.

TECHNICAL FIELD

Example embodiments relate to a conductive via to be applied to several substrates, such as multi-layer circuit boards, low temperature co-fired ceramics (LTCCs), integrated circuits (ICs), thick-film ceramics, thin-film ceramics or silicon-on-glass substrate processes, and more particular, to a high frequency and wide band impedance matching via.

BACKGROUND

In products related to electronic systems, such as the multi-layer circuit boards, LTCCs, ICs, thick-film ceramics, thin-film ceramics and silicon-on-glass substrate processes, the printed circuit board (PCB), which supports electronic components generally, is a plan substrate which was made up of glass fibers and on which conductive circuitry was printed. With the prevailing trend in electronic products being 'slim type' and 'mini size', the development of the PCB is inclined to the one with a small-bore diameter, high density, multi-layer and thin circuit. An excellent scheme of increasing the density of the circuit is the multi-layer circuit board.

Once the number of layers of the PCB is increased, it results such serious interference that signal transmission lines must be through each layer. Further, since the prevailing trend in electronic products is high frequency, high transmission speed and a higher requirement for accuracy of the transmission impedance and efficiency of the signal transmission, the impedance dis-matching results in the signal bounce to cause many problems. In light cases, the system will work unstable, and in serious cases, the system will be damaged. In consequence, the circuitry design for the PCB is aimed at its width and distance of the signal transmission lines, further, at setting up the balanced impedance design. However, the circuitry design for the conventional PCB is chiefly and simply aimed at the signal transmission in a plane and not aimed at the signal transmission in a perpendicular. A difficult point of the circuitry design for the multi-layer circuit board is the signal transmission between the different layers in a perpendicular direction, so it will avoid vertically transmitting the signals over the vias between the layers in a perpendicular direction in many high-frequency circuitry designs.

In the U.S. patent application of publication No. 2004/0053014, a multilayer printed board is introduced. It has first and second signal transmission lines and first and second ground layers. A signal via is connected between the first and second transmission lines. Ground vias are connected between the first and second ground layers, and they are near to the signal via but not connected with it. The end of the first ground layer protrudes with respect to the second ground layer and extends nearer to the signal via than the second ground layer. Thus, it is possible to stabilize the characteristic impedance of the first transmission line. Further, the first and second ground layers are interlaced, so that it is procured to control the characteristic impedance effectively. However, this circuitry design is complicated, so that flexibility in circuit application is decreasing and precision control of its PCB is not easy.

SUMMARY

Example embodiments are directed to a high frequency and wide band impedance matching via, to substantially solve the problems in the prior art. As an application to multi-layer printed circuit boards, for example, signal transmission traces sited on the different circuit layers are connected by vertical signal transmission vias, and vertical ground vias corresponding to the vertical signal transmission vias are sited to stabilize the characteristic impedance of the signal transmission traces, so that electrical signals having high frequency and high speed are completely transmitted in three-dimensional space.

To achieve these and other advantages and in accordance with example embodiments, as embodied and broadly described, a high frequency and wide band impedance matching via, which may be applied to each substrate, which may include a first signal transmission trace, a second signal transmission trace, a signal via, a first ground layer, a second ground layer and a ground via, wherein the signal and the ground vias are substantially perpendicular to the first and the second signal transmission traces and the first and the second ground layers. The first and the second signal transmission traces may be sited on different surface of the circuit layer, respectively. Moreover, the first signal transmission trace may be connected to the second signal transmission trace by the signal via, which may be sited within the substrate, and the ground via may be sited adjacent to the signal via. Moreover, the first and the second ground layers may be opposite to the first and the second signal transmission traces, respectively, and connected by the ground via. The impedance may be controlled by adjusting the distance between the ground via and the signal via, thereby enabling the signal transmission of the signal via, to have matching impedance. More preferably, the length of the signal via may be similar to that of the ground via.

The structure has two ground vias, which may be symmetrically sited around the signal via to be similar to a coplanar waveguide, and further, the structure has at least two ground vias which may be symmetrically sited around the signal via to be similar to a coaxial cable. Furthermore, each ground via may be connected to another by a conductor portion, thereby promoting electric characteristics of the structure.

To match different circuitry design, example embodiments may be applied in the signal transmission for differential pairs. The structure includes a first signal transmission differential pair, a second signal transmission differential pair, a pair of signal vias, plane conductor traces and several ground vias, wherein the pair of ground vias may be substantially perpendicular to the first and the second signal transmission differential pairs. The first and the second signal transmission differential pairs may be respectively sited on two surfaces of the substrate, and the first and the second signal transmission differential pairs may be connected by the pair of signal vias. The ground vias may be connected to each other, and may be adjacent to the signal vias at a distance and symmetrically sited in the insulation layer to match the signal vias. More preferably, the length of the signal via may be similar to that of the ground via.

BRIEF DESCRIPTION OF THE DRAWINGS

The invention will become more fully understood from the detailed description given hereinbelow illustration only and thus does not limit the present invention, wherein.

DETAILED DESCRIPTION OF EXAMPLE EMBODIMENTS

A conductive through-via according to the invention is applied to all kinds of substrates, such as multi-layer circuit boards, low temperature co-fired ceramics (LTCCs), integrated circuits (ICs), thick-film ceramics, thin-film ceramics or silicon-on-glass substrate processes, and has ground vias sited around signal vias, thereby enabling the signal transmission of the signal vias to have impedance match. As an application to multi-layer printed circuit boards, for example, a detailed structure is described below. One of the object of the multi-layer printed circuit board with the impedance matching is achieved through a design of the structure. The structure of the multi-layer printed circuit board is a combination of insulation layers and circuit layers, which are stacked in repeating order of each other, in where circuit layers are electrically connected to another one by vertical signal vias, and vertical ground vias are sited appropriately, to enable the signal transmission of the signal vias to achieve impedance match.

Figure 1A:
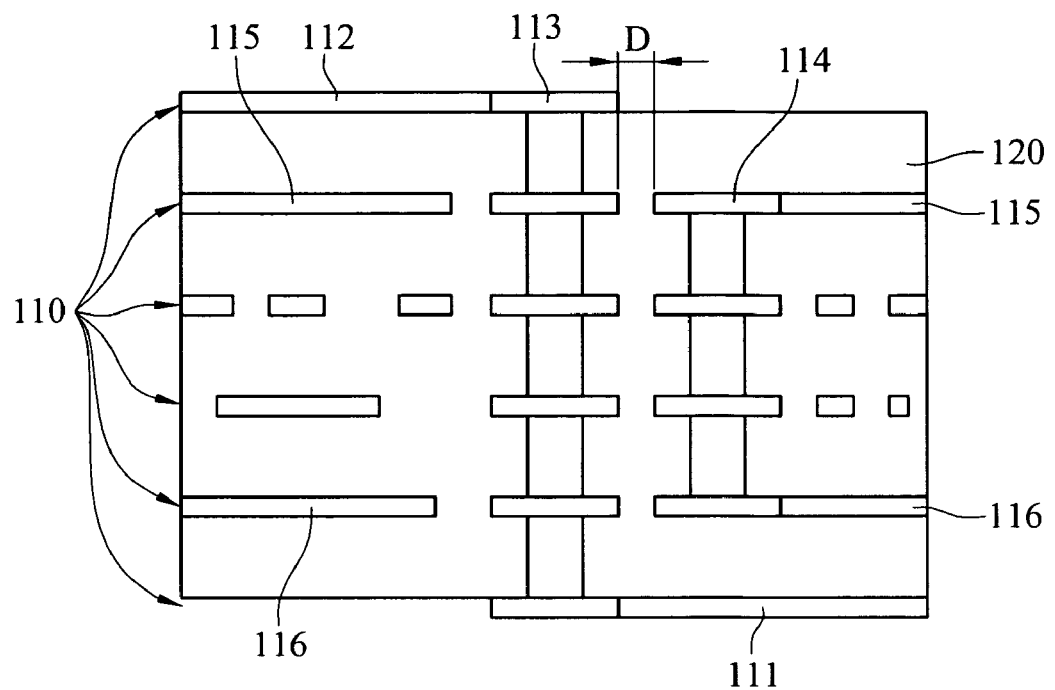
FIG. 1A and FIG. 1B are schematic views showing cross-sections of first and second embodiments according to an example embodiment, respectively.
Figure 1B:
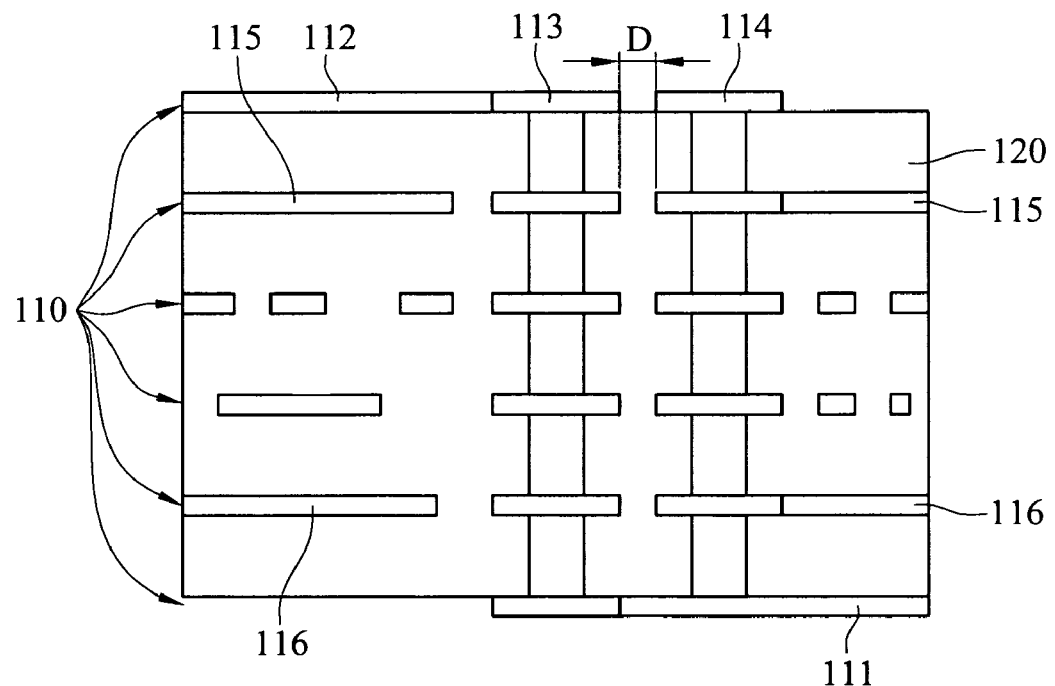

In an example embodiment, the multi-layer printed circuit board is a combination of several insulation layers and several circuit layers, which are stacked staggeredly. Refer to FIG. 1A, which is a cross-section of a first embodiment according to example embodiment. A six-layer printed circuit board, for example, has six circuit layers 110, which are separated by insulation layers 120. The circuit layer 110 may be a signal transmission trace or a ground layer. The signal and the ground vias 113, 114 are substantially perpendicular to first and second signal transmission traces 111, 112, and first and second ground layers 115, 116. The first signal transmission trace 111 is sited on the bottom circuit layer 110, as a first surface of the substrate, the second signal transmission trace 112 is sited on the top circuit layer 110, as a second surface of the substrate, and the several insulation layers 120 separate them. The first signal transmission trace 111 is connected to the second signal transmission trace 112 by the signal via 113, and the ground via 114 sited adjacent to the signal via 113 runs through internal circuit layers and is at a distance D from the signal via 113. Herein, the ground via 114 connects the first ground layer 115 with the second ground layer 116. In other words, the first signal transmission trace 111 is opposite to the first ground layers 115, the second signal transmission trace 112 is opposite to the second ground layers 116, and the signal via 113 is opposite to the ground via 114. Thus the impedance is controlled through adjusting the distance D, so that the signal transmission of the signal via 113 has impedance match. More preferably, the length of the ground via 114 is similar to that of the signal via 113, and the ground via 114 is not connected to the first and second signal transmission traces 111, 112, as shown in FIG. 1B.

Figure 2:
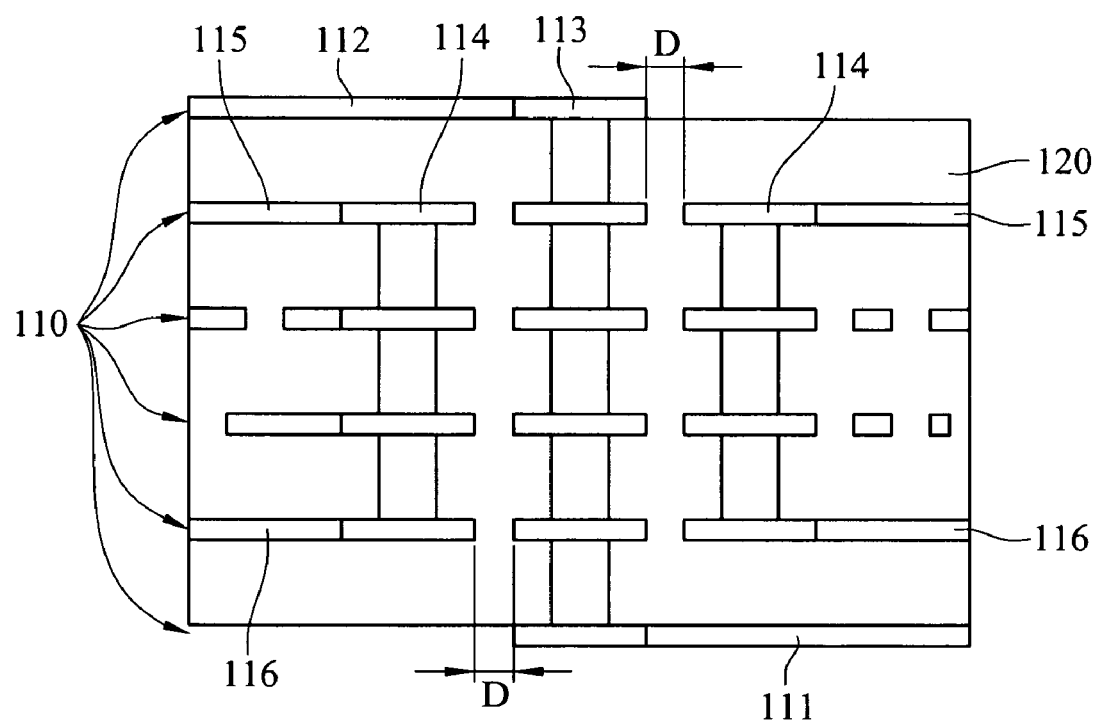
FIG. 2 is a schematic view showing a cross-section of a third embodiment according to an example embodiment.

In another embodiment, several ground vias are symmetrically sited around the signal via to form a structure similar to a coplanar waveguide. FIG. 2 illustrates a cross-section of a structure according to a third embodiment. Referring to FIG. 2, a six-layer printed circuit board, for example, has six circuit layers 110, which are separated by insulation layers 120, where the circuit layer 110 may be a signal transmission trace or a ground layer. The structure according to the second embodiment of the invention comprises a first signal transmission trace 111, a second signal transmission trace 112, a signal via 113 and two ground vias 114, wherein the signal and the ground vias 113, 114 are substantially perpendicular to the first and the second signal transmission traces 111, 112, and first and second ground layers 115, 116. The first and the second signal transmission trace 111, 112 are respectively sited on the bottom and top circuit layer 110, and the several insulation layers 120 separate them. The first signal transmission trace 111 is connected to the second signal transmission trace 112 by the signal via 113, and the ground vias 114 sited adjacent and symmetrical to the signal via 113 run through internal circuit layers 110 and are at a distance D from the signal via 113. Herein, the ground vias 114 connect the first ground layer 115 with the second ground layer 116. In other words, the first signal transmission trace 111 is opposite to the first ground layer 115, the second signal transmission trace 112 is opposite to the second ground layer 116, and the signal via 113 is opposite to the ground vias 114. Thus the impedance is controlled thought adjusting the distance D, so that the signal transmission of the signal via 113 has impedance match. The structure further comprises at least one conductor strip (not showed in the drawing). The ground vias are connected by the conductor strip sited around the signal via 113 and are separated from the signal via 113. The conductor strip is the cambered conductor strip or a hollow conductor strip. The form of the hollow conductor strip is circular, such as a substantial circular form, a rectangle, etc. In this case, the number of ground vias is two. However, it can be more than two according to an example embodiment. More preferably, the length of the signal via is also similar to that of the ground via (not shown to conveniently illustrate).

Figure 3A:
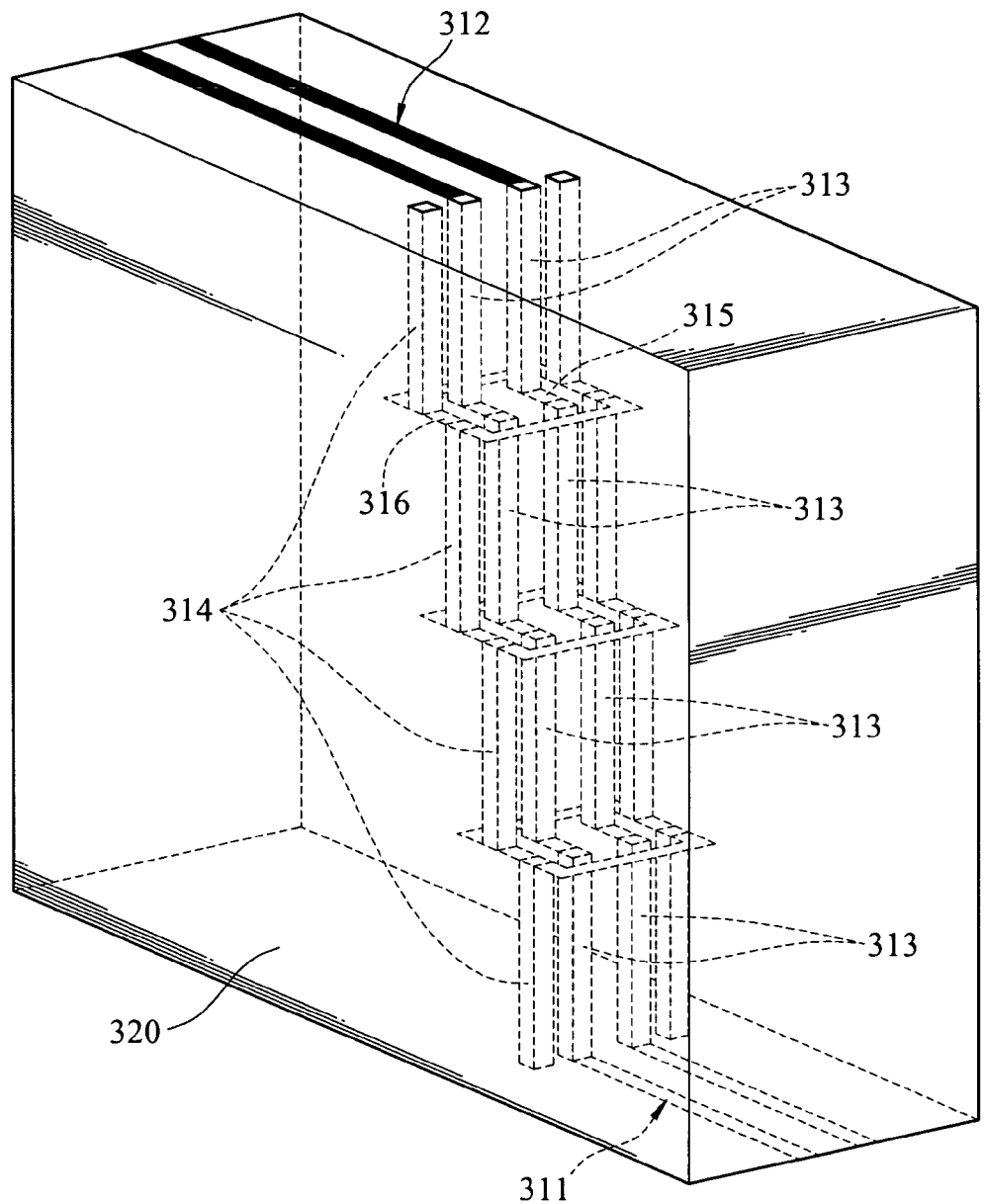
FIG. 3A, FIG. 3B, FIG. 3C and FIG. 3D are perspectives showing three-dimensional structures of fourth, fifth, sixth and seventh embodiments according to example embodiments, respectively.

Further, the structure according to the invention is applied in the signal transmission for differential pairs. Refer to FIG. 3A, which is three-dimensional structures of a fourth embodiment according to example embodiments. In this example embodiment, the structure comprises a first signal transmission differential pair 311, a second signal transmission differential pair 312, a pair of signal vias, several ground vias 314 and a conductor strip. In this case, the conductor strip is a hollow conductor strip 316. The pair of ground vias 314 is substantially perpendicular to the first and the second signal transmission differential pairs 311, 312. The first and the second signal transmission differential pairs 311, 312 are separated with an insulation layer 320, and the first and the second signal transmission differential pairs 311, 312 are connected by several signal vias. The signal vias comprise several vertical signal vias 313 and several plane conductor traces 315. The vertical signal vias 313 are intersected in the insulation layer 320, to form a vertically electrical connection, and the plane conductor traces 315 are connected to the vertical signal vias 313 to form an electrical connection in the plane. The ground vias 314 are adjacent to the signal vias and are symmetrically sited in an opposite position of the signal vias and in the insulation layer 320, to match the vertical signal vias 313. The ground vias 314 are electrically connected by the hollow conductor strip 316.

Figure 3B:
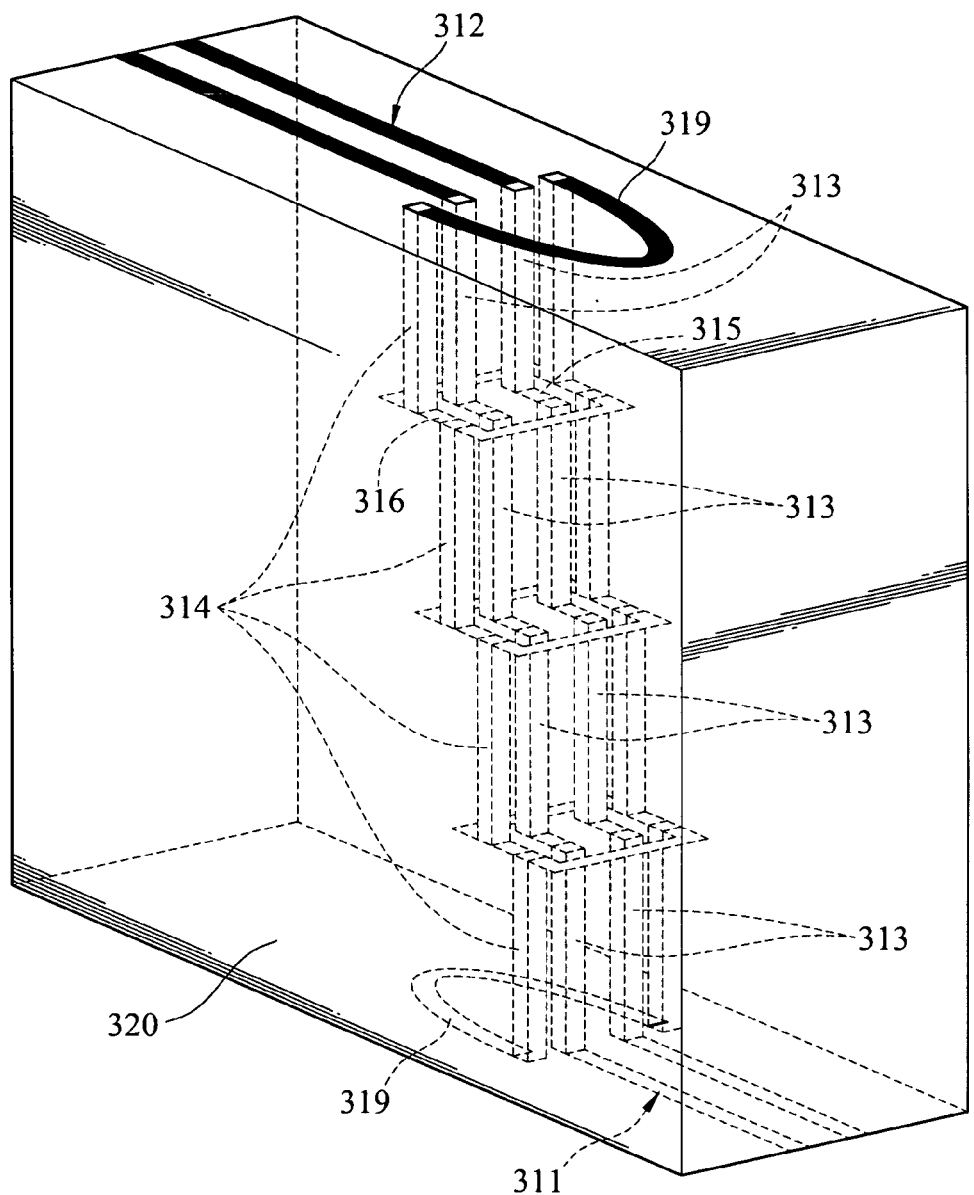

The hollow conductor strip 316 surrounds the vertical signal vias 313, as shown in FIG. 3A; and further, the conductor strip 319 is a cambered conductor strip sited in one side of the vertical signal vias 313, as shown in FIG. 3B. Herein, the signal via 313 is opposite to the ground via 314, and the length of the signal via 313 is preferably similar to that of the ground via 314.

Figure 3C:
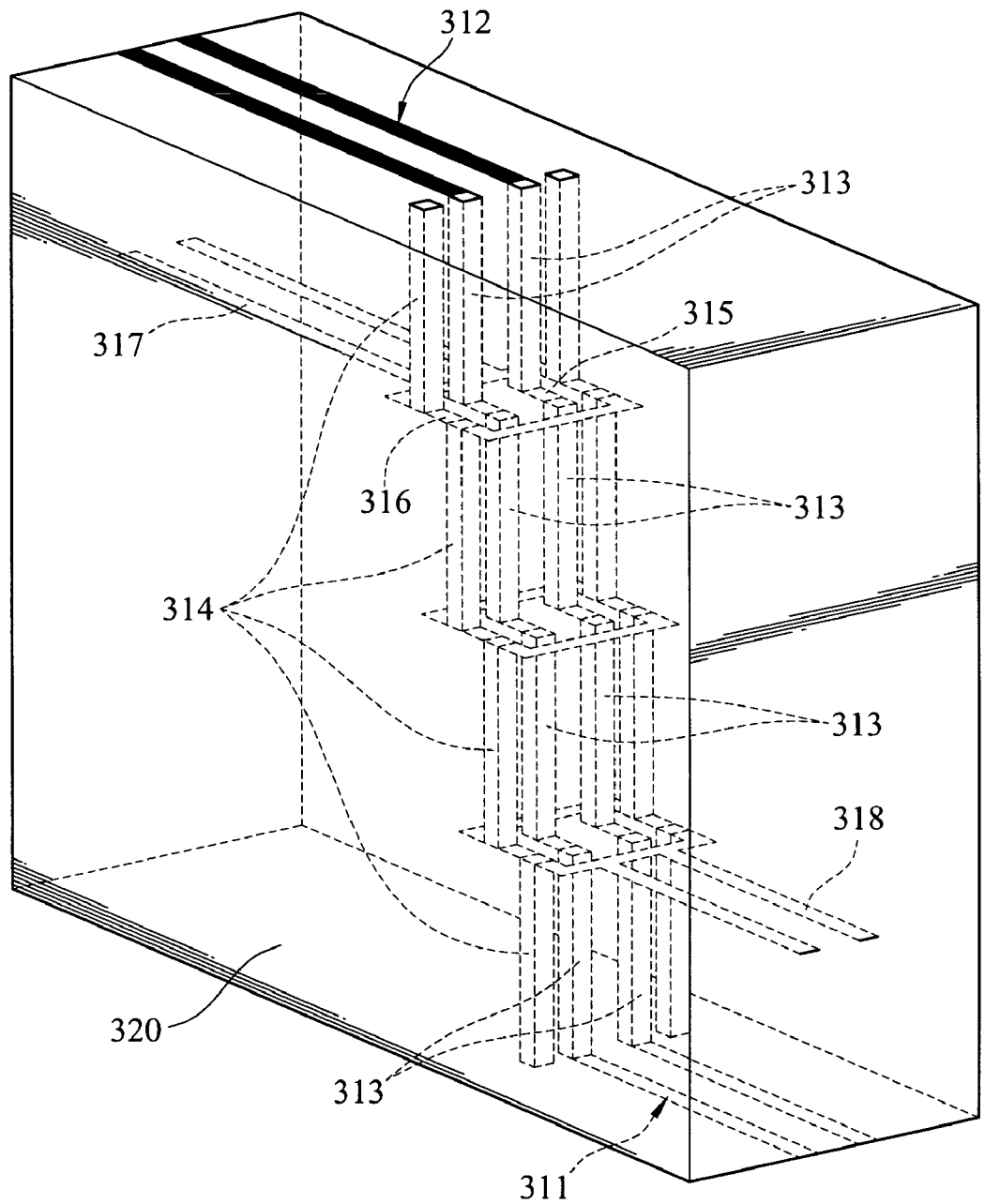
Figure 3D:
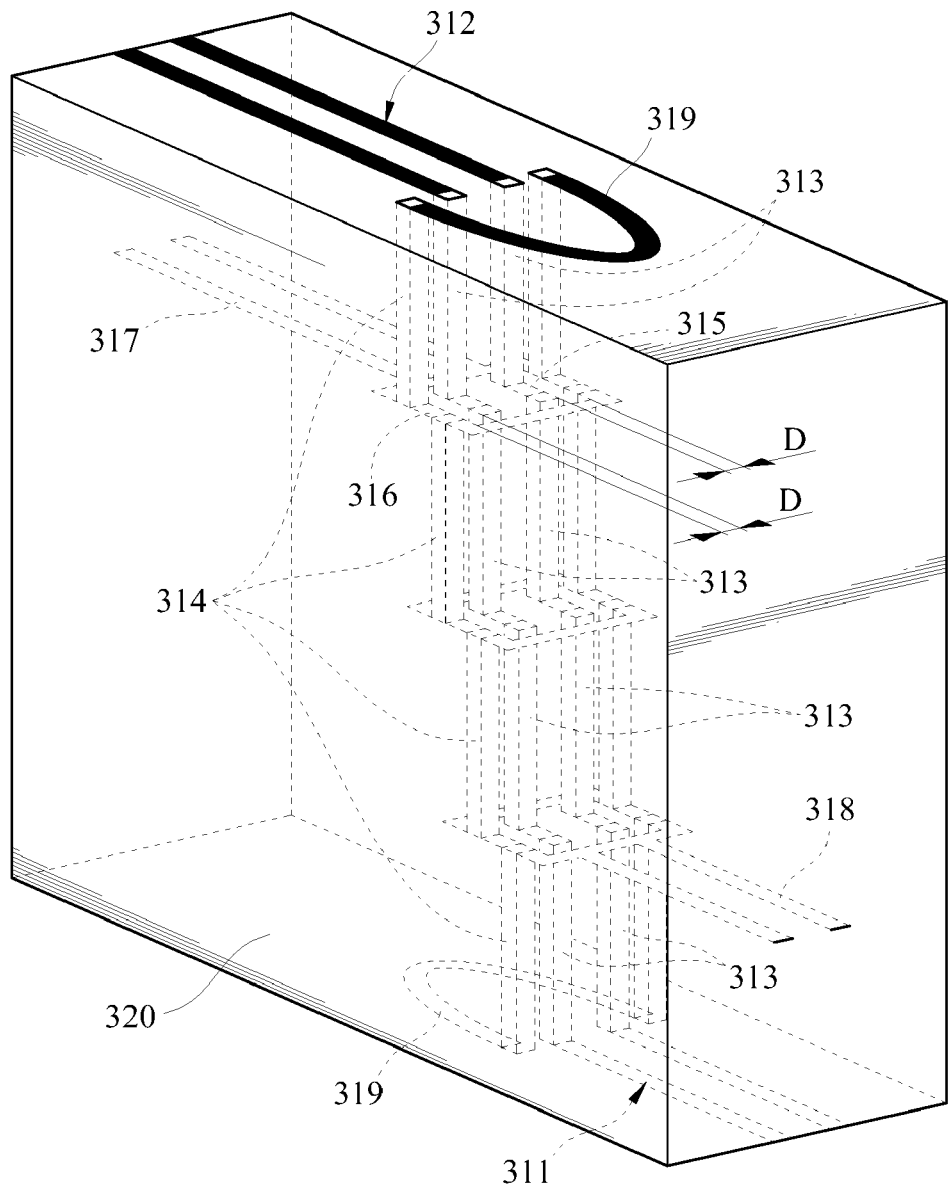

In fact, the first signal transmission differential pair 311 may be opposite to the first ground layer 317, and the second signal transmission differential pair 312 may be opposite to the second ground layer 318, and the first and second ground layers 317, 318 are connected to the hollow conductor strip 316, as shown in FIG. 3C and FIG. 3D. That is, the first and second ground layers 317, 318 are connected to each other by the ground vias 314. In this case, although the first and second ground layers 317, 318 are traces in FIG. 3C and FIG. 3D, they may be whole planes according to actual requirement for circuit design.

To describe example embodiments more clearly, a six-layer printed circuit board is simulating the experiment of a high-frequency electromagnetic effect. Assume that the depth of each insulation layer is ten milli-inches (mil), the depth of the circuit layer is one milli-inch (mil), the diameter of the conductor strip is twenty milli-inches (mil), the total length of the transmission trace is two hundreds milli-inches (mil), and the material of the insulation layer is fiberglass FR4 (DK=4.2 and DF=0.03). The description of a schematic view, showing a three-dimensional structure and the stimulated result thereof, follows.

Figure 4A:
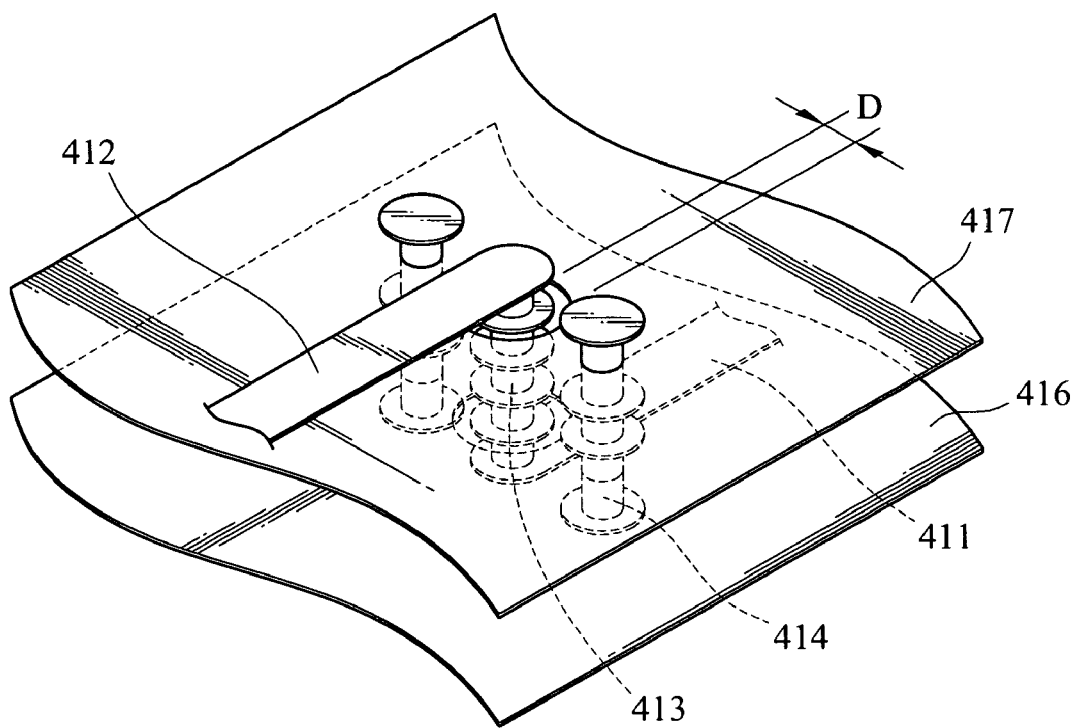
FIG. 4A is a schematic view showing a three-dimensional structure of a eighth embodiment according to an example embodiment.

Refer to FIG. 4A, the structure comprises a first signal transmission trace 411, a second signal transmission trace 412, a signal via 413, and two ground vias 414. The signal and the ground vias 413, 414 are substantially perpendicular to the first and the second signal transmission traces 411, 412. The first and the second signal transmission traces 411, 412 are separated with an insulation layer (not shown to conveniently illustrate), and the first and the second signal transmission traces 411, 412 are connected by the signal via 413. The ground vias 414 are sited adjacent to the signal via 413 at a distance D and are symmetrically sited on the side of the signal via 413. Herein, first ground layer 416 is opposite to the first signal transmission trace 411, e.g. above the first signal transmission trace 411, and it is connected to the ground vias 414. Moreover, second ground layer 417 is opposite to the second signal transmission trace 412, e.g. under the second signal transmission trace 412, and it is connected to the ground vias 414. Furthermore, the signal vias 413 is opposite to the ground vias 414, and the length of the signal via 413 is preferably similar to that of the ground vias 414.

Figure 4B:
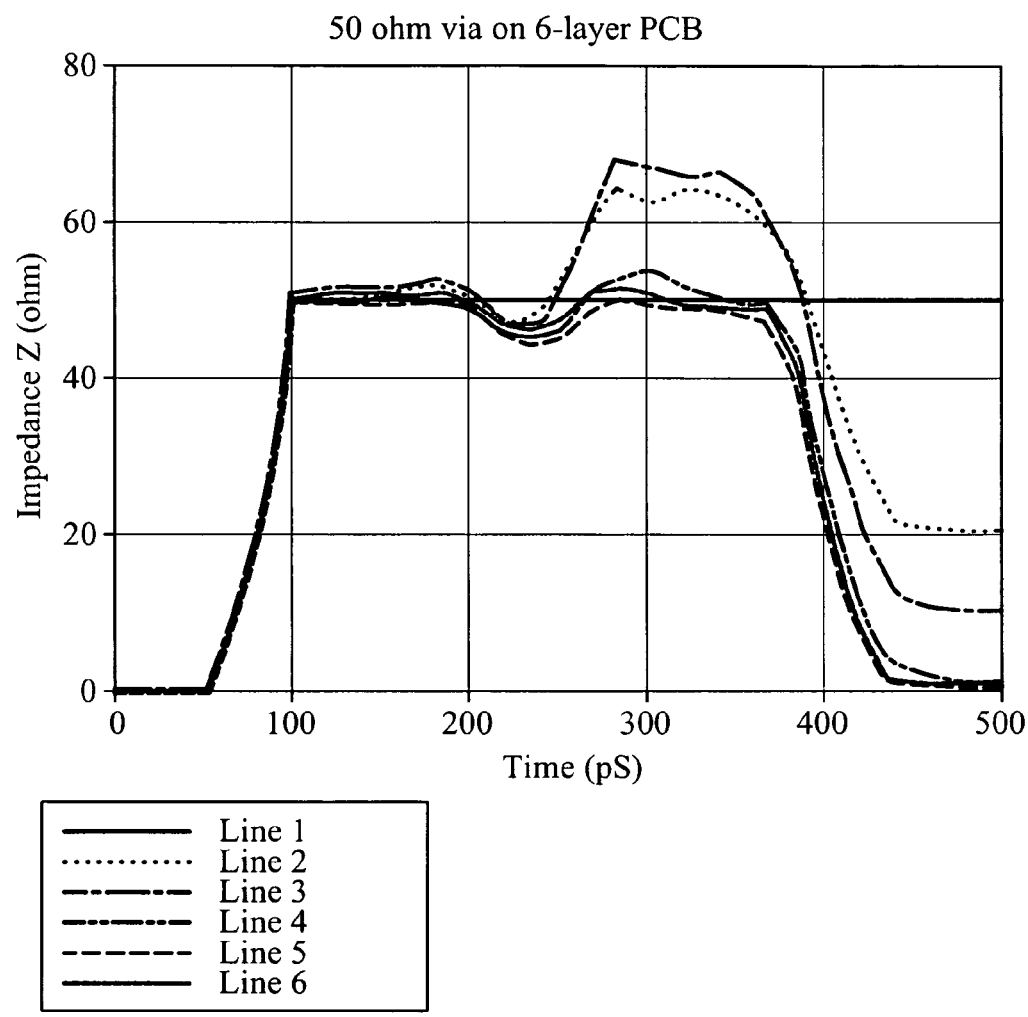
FIG. 4B is a chart showing the measurements of impedance distribution of the three-dimensional structure in FIG. 4A.

Refer to FIG. 4B, which is a schematic view of impedance distribution of the stimulated result, wherein the transverse axis represents impedance (Z) and vertical axis represents time (T). In FIG. 4B, Line 1 represents the 50 ohm transmission line, Line 2 represents the impedance transmission when the first ground layer opposite to the first signal transmission trace is not connected to the second ground layer is opposite to the second signal transmission trace, Line 3 represents the impedance transmission when the connection between the first ground layer opposite to the first signal transmission trace and the second ground layer is opposite to the second signal transmission trace is at a distant place, Line 4 represents the impedance transmission when there is a ground via opposite to the signal via and the ground via connects the first ground layer with the second ground layer, Line 5 represents the impedance transmission when there are a pair of the ground vias opposite to and symmetrically around the signal via and the ground vias connect the first ground layer with the second ground layer, and Line 6 represents the impedance transmission when there are a pair of the ground vias opposite to and symmetrically around the signal via, the ground vias connect the first ground layer with the second ground layer and there are a pair of circular conductor portions connecting the ground vias.

Contrasted with the same structure without ground vias and the structures of the first stimulated embodiment having a different D value, the structure without ground vias has the most dis-matching impedance and its maximum discrepancy is 40.1%. The maximum discrepancy of the matching impedance in the structures of the first stimulated embodiment, of which the distance between the ground via and the signal via is 10 mils (i.e. D=10 mils) is 9.5%. The maximum discrepancy of the matching impedance in the structures of the first stimulated embodiment, of which the distance between the ground via and the signal via is 15 mils (i.e. D=15 mils) is 5.3%. According to the result, the dis-matching impedance of the structure is effectively improved by applying the invention and the better impedance match is acquired by adjusting the distance between the ground via and the signal via.

Figure 5A:
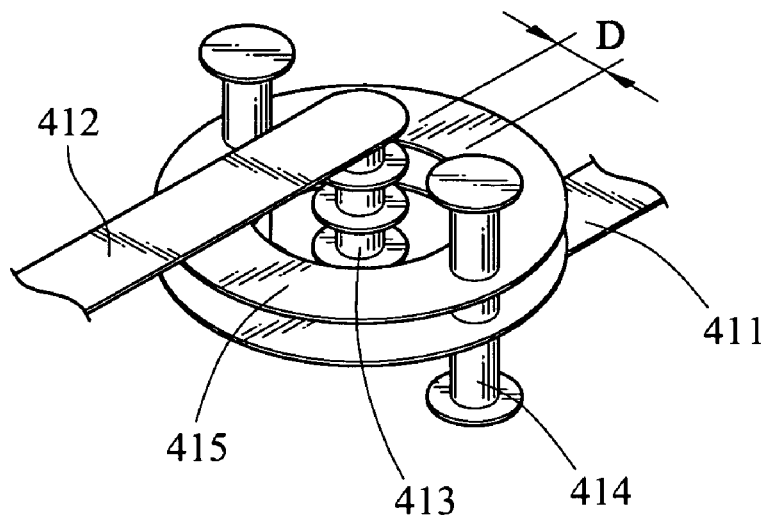
FIG. 5A and FIG. 5B are schematic views showing a three-dimensional structure of ninth and tenth embodiments according to an example embodiment, respectively.
Figure 5B:
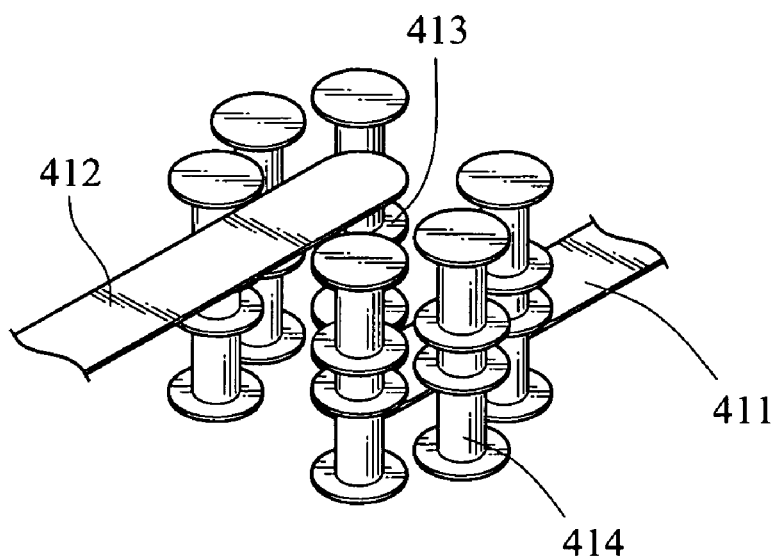
Figure 5C:
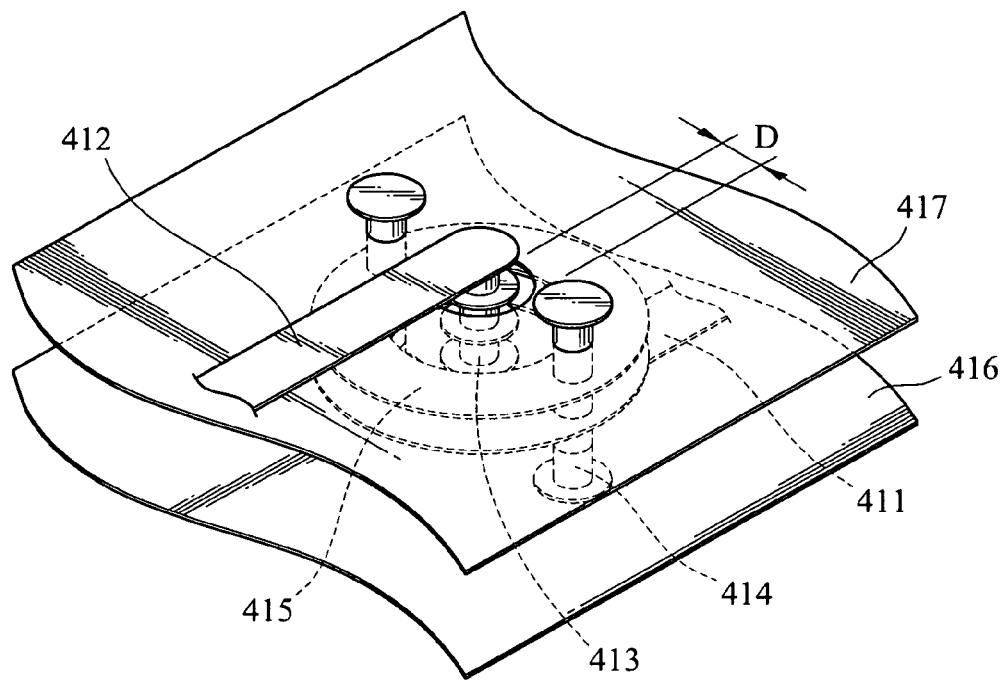
FIG. 5C and FIG. 5D are perspectives showing a three-dimensional structure of eleventh and twelfth embodiments according to an example embodiment, respectively.
Figure 5D:
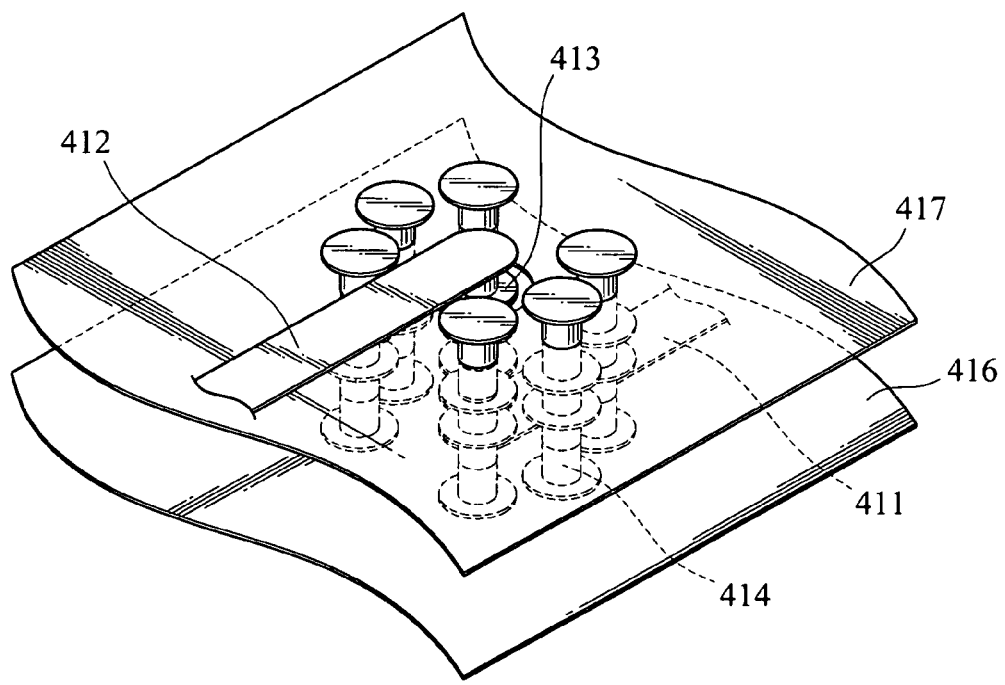

Further, the ground vias are connected to each other by conductor strips. Refer to FIG. 5A, the structure comprises a first signal transmission trace 411, a second signal transmission trace 412, a signal via 413, two ground vias 414 and two circular conductor strips 415. The signal and the ground vias 413, 414 are substantially perpendicular to the first and the second signal transmission traces 411, 412. The first and the second signal transmission traces 411, 412 are separated with an insulation layer (not shown to conveniently illustrate), and the first and the second signal transmission traces 411, 412 are connected by the signal via 413. The ground vias 414 are sited adjacent to the signal via 413 and symmetrically sited on the side of the signal via 413. Moreover, the ground vias 414 are electrically connected by the circular conductor strips 415. On the other hand, the structure, which is similar to a coaxial cable, has a plurality of ground vias 414 symmetrically sited around the signal via 413, as shown in FIG. 5B. Herein, first ground layer 416 is opposite to the first signal transmission trace 411, e.g. above the first signal transmission trace 411, and it is connected to the ground vias 414. Moreover, second ground layer 417 is opposite to the second signal transmission trace 412, e.g. under the second signal transmission trace 412, and it is connected to the ground vias 414, as shown in FIG. 5C and in FIG. 5D. Further, each of the first and second ground layers 416, 417 may be connected to the circular conductor strip 415, as shown in FIG. 5D. Furthermore, the length of the signal via 13 is preferably similar to that of the ground vias 414. In this case, although the first and second ground layers 416, 417 are whole planes in FIG. 5C and FIG. 5D, they may be traces according to actual requirement for circuit design.

Figure 6A:
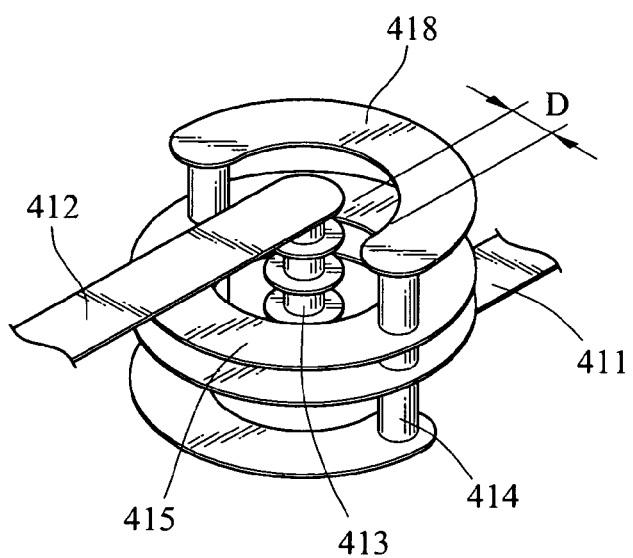
FIG. 6A is a schematic view showing a three-dimensional structure of an thirteenth embodiment according to an example embodiment.
Figure 6B:
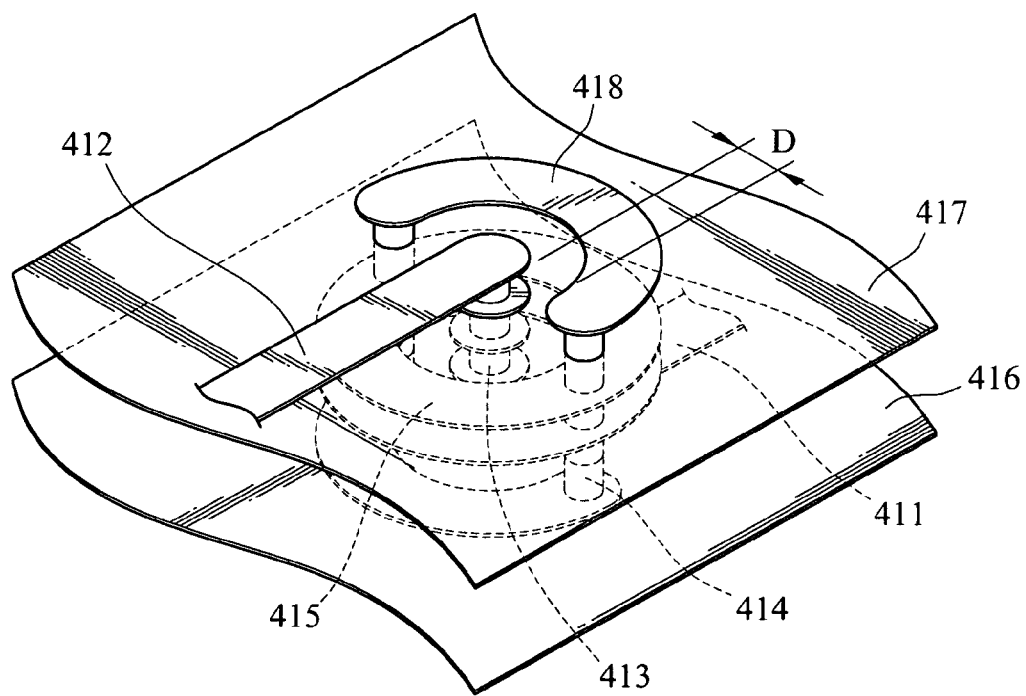
FIG. 6B are perspectives showing a three-dimensional structure of a fourteenth embodiment according to an example embodiment.

Furthermore, the conductor strips 418 are semicircular, as shown in FIG. 6A. Refer to FIG. 6A, the structure comprises a first signal transmission trace 411, a second signal transmission trace 412, a signal via 413, two ground vias 414, two circular conductor strips 415 and two semicircular conductor strips 418. The signal and the ground vias 413, 414 are substantially perpendicular to the first and the second signal transmission traces 411, 412. The first and the second signal transmission traces 411, 412 are separated by an insulation layer (not shown to conveniently illustrate), and the first and the second signal transmission traces 411, 412 are connected by the signal via 413. The ground vias 414 are sited adjacent to the signal via 413 and symmetrically sited on the side of the signal via 413. The ground vias 414 are electrically connected by the circular conductor strips 415. Moreover, the tops and the bottoms of the ground vias 414 are electrically connected by the semicircular conductor strips 418 respectively. Further, first ground layer 416 is opposite to the first signal transmission trace 411, e.g. above the first signal transmission trace 411, and it is connected to the ground vias 414. Moreover, second ground layer 417 is opposite to the second signal transmission trace 412, e.g. under the second signal transmission trace 412, and it is connected to the ground vias 414, as shown in FIG. 6B. Further, although the first and second ground layers 416, 417 are whole planes in FIG. 6B, the first and second ground layers may be traces according to actual requirement for circuit design, and each of they may be connected to the circular conductor strip connecting the ground vias. Furthermore, the length of the signal via 13 is preferably similar to that of the ground vias 414.

Certain variations would be apparent to those skilled in the art, which variations are considered within the spirit and scope of the claimed invention.

What is claimed is:

1. A high frequency and wide band impedance matching via, adapted to a substrate having a top circuit layer, a bottom circuit layer, a first ground layer adjacent to the top circuit layer, and a second ground layer adjacent to the bottom circuit layer, the high frequency and wide band impedance matching via comprising:

a first differential signal transmission pair on the bottom circuit layer;

a second differential signal transmission pair on the top circuit layer, the first and the second differential signal transmission pair being parallel to a first axis;

a plurality of paired signal traces, connected between the first differential signal transmission pair and the second differential signal transmission pair, the plurality of paired signal traces comprising:

a plurality of paired signal vias substantially perpendicular to the first axis; and a plurality of side paired plane conductive sections on the first and second ground layers respectively, and connected between the adjacent paired signal vias; and a plurality of paired ground traces, comprising:

a first ground pair on the first ground layer;

a second ground pair on the second ground layer, the first and the second ground pair substantially parallel to the first axis;

a plurality of paired ground vias substantially perpendicular to the first axis; and two side rectangular conductive rings, respectively, on the first ground layer and the second ground layer, each of the plurality of rectangular conductive rings connected with the first and the second ground pair and the plurality of paired ground vias, each of the plurality of rectangular conductive rings surrounding ends of the plurality of the paired signal vias and the plurality of side paired plane conductive sections on the same layer thereon;

wherein the plurality of paired signal vias and the plurality of paired ground vias between two adjacent layers are substantially aligned in a plane perpendicular to the first axis, the offsets along the first axis between the adjacent aligning planes are substantially the same.

2. The impedance matching via of claim 1, wherein the substrate further has an intermediate circuit layer between the first and the second ground layer, the paired signal traces further comprise an intermediate paired plane conductive sections on the intermediate circuit layer, the intermediate paired plane conductive sections is connected with the adjacent paired signal vias, the paired ground traces further comprise an intermediate rectangular conductive ring on the intermediate circuit layer, and the intermediate rectangular conductive ring embraces the intermediate paired plane conductive sections.

3. The impedance matching via of claim 2, wherein the directions of the offsets between the adjacent aligning planes are parallel to the first axis and substantially the same.

4. The impedance matching via of claim 3, further comprising:

a first conductive arc strip on the bottom circuit layer, connected with the plurality of paired ground vias adjacent to the bottom circuit layer; and a second conductive arc strip on the top circuit layer, connected with the plurality of paired ground vias adjacent to the top circuit layer.

5. The impedance matching via of claim 4, wherein the plurality of paired signal vias on one of the aligning planes are disposed within the plurality of paired ground vias on the one of the aligning planes.

6. The impedance matching via of claim 5, wherein the distance between one of the plurality of paired signal vias and one of the plurality of paired ground vias on the one of the aligning planes is substantially the same as the distance between another of the plurality of paired signal vias and another of the plurality of paired ground vias on the one of the aligning planes.

* * * * *

UNITED STATES PATENT AND TRADEMARK OFFICE
CERTIFICATE OF CORRECTION

PATENT NO.         : 8,058,956 B2                                          Page 1 of 1
APPLICATION NO.    : 12/801673
DATED              : November 15, 2011
INVENTOR(S)        : Uei-Ming Jow et al.

It is certified that error appears in the above-identified patent and that said Letters Patent is hereby corrected as shown below:

On the Title page of the patent, Item [56] Column 1, Line 31:

Jan. 14, 2005   (TW) .......................................... 94104223 A should read:

--Jan. 14, 2005  (TW) ......................................... 94101223 A--

Signed and Sealed this
Fourteenth Day of February, 2012

David J. Kappos
*Director of the United States Patent and Trademark Office*